(12) United States Patent
Volk

(10) Patent No.: US 6,457,095 B1
(45) Date of Patent: Sep. 24, 2002

(54) METHOD AND APPARATUS FOR SYNCHRONIZING DYNAMIC RANDOM ACCESS MEMORY EXITING FROM A LOW POWER STATE

(75) Inventor: Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/458,833

(22) Filed: Dec. 13, 1999

(51) Int. Cl.⁷ .............................................. G06F 12/00
(52) U.S. Cl. ...................... 711/105; 711/169; 713/310; 713/323
(58) Field of Search ................................ 711/105, 104, 711/169; 713/310, 323

(56) References Cited

U.S. PATENT DOCUMENTS

| | | | |
|---|---|---|---|
| 5,319,601 A | 6/1994 | Kawata et al. | 365/226 |
| 5,337,285 A * | 8/1994 | Ware et al. | 365/227 |
| 5,781,782 A | 7/1998 | Tachikawa | 713/330 |
| 5,828,619 A | 10/1998 | Hirano et al. | 365/222 |
| 6,088,290 A * | 7/2000 | Ohtake et al. | 365/233 |
| 6,112,306 A * | 8/2000 | Volk et al. | 713/323 |

FOREIGN PATENT DOCUMENTS

| | | |
|---|---|---|
| JP | 11 066849 | 7/2000 |
| WO | PCT/US 00/ 41268 | 10/2000 |

OTHER PUBLICATIONS

PCT Search Report in connection with International Application No. PCT/US99/23168 dated Dec. 15, 1999 (6 pages).

* cited by examiner

Primary Examiner—Reginald G. Bragdon
(74) Attorney, Agent, or Firm—Blakely, Sokoloff, Taylor & Zafman LLP

(57) ABSTRACT

A method and apparatus for exiting a dynamic random access memory from a low power state is provided. The exit from the low power state is first initiated. After the expiration of an exit delay period, a quiet time command is routed through a queue circuit. In one embodiment the use of a bypass circuit allows the interruption of the memory pipeline with a subsequent restart of the pipeline without excessive delay. A flexible clock is delayed by the onset of the quiet time command until the subsequent quiet time event.

25 Claims, 7 Drawing Sheets

METHOD AND APPARATUS FOR SYNCHRONIZING DYNAMIC RANDOM ACCESS MEMORY EXITING FROM A LOW POWER STATE

FIELD OF THE INVENTION

The present invention relates to dynamic random access memory, and more specifically, to low power states of dynamic random access memory.

BACKGROUND

Dynamic random access memory (DRAM) is a general-purpose high-performance memory device suitable for use in a broad range of applications. DRAM allows high bandwidth for multiple, simultaneous, randomly addressed memory transactions.

A particular DRAM may include a pair of low power consumption states for lowering overall system power consumption during periods when data of the DRAM is not accessed. These low power consumption states are the nap and powerdown states. The powerdown (PDN) state is the lowest power state available. In this state the information in the DRAM core is maintained with self-refresh, using an internal timer to refresh the memory. The PDN state has a relatively long exit latency period because of clock resynchronization. An internal clock in the memory is turned off during the PDN state and needs to be resynchronized to an external clock in order to permit normal memory access.

The nap (NAP) state is another low power state in which either self-refresh or refresh-activate (REFA) refresh methods are used to maintain the information in the DRAM core. The NAP state has a shorter exit latency period because the internal clocks in the memory system remain synchronized relative to the external clock signal.

Although the NAP and PDN states are distinct states and have certain differences, in the present application they will often be discussed together as a NAP/PDN state.

FIG. 1 illustrates a state diagram of a prior art memory. State 110 is the NAP/PDN state. The states used to enter into the NAP/PDN state are not illustrated in this figure. The memory may remain in the NAP/PDN state 110 for a period of time. A signal 120 sent by the CPU is received by the memory controller to initiate exit from the NAP/PDN state, moving the memory to the wait for NAP exit delay state 130. The memory is awakened, clocks are resynchronized, and other "clean-up" steps are taken at this point. The time used for these steps is the "NAP exit delay", $t_{NXB}$, or "PDN exit delay", $t_{PXB}$.

After the NAP exit delay or PDN exit delay, the system receives simultaneous quiet times on the row-access-control and column-access-control signal pins of the memory. This moves the memory to the looking-for-packet-frame state 140.

FIG. 2 illustrates a timing diagram of the prior art system. The clock-to-master (CTM) and clock-from-master (CFM) signals 270 are used by the memory to time data to and from the memory controller. The row-access-control signals 210 and column-access-control signals 220 carry data that identifies the memory location for memory access. The DQAO . . . 8 and DQBO . . . 8 signals 230 are read/write data signals on a data transfer bus.

The SCK signal 240 is a clock signal that is used to time the exit from the NAP/PDN mode. The CMD signal 250 is a command signal used to initiate exiting from the NAP/PDN state. The CMD signal 250 is sampled on both the rising edge and the falling edge of SCK signal 240. To signal the exit from the NAP/PDN mode, the CMD signal 250 transitions from a 0 on a first falling clock edge 242 to a 1 on the next rising clock edge 244. Therefore, if after a falling and rising edge of SCK signal 240 there is a "01" on the CMD input, NAP/PDN state will be exited. On a falling edge 242 of the SCK signal 240, the SIOin signal 260 indicates whether the exit is from a NAP state or a PDN state.

In PDN mode, the CTM/CFM clocks 270 are stopped and must be restarted and stabilized for time $t_{CE}$ before a PDN exit command can be sent. In NAP mode, the CTM/CFM clocks 270 are running, and the nap exit command can be sent whenever needed. In both cases, dynamic locked loops (DLLs) in the DRAMs must be restarted and the internal timing circuits of the memory must be resynchronized. After the CTM/CFM clocks 270 become stable, a 0 or 1 is sent on the SIO input 260 on the next falling edge 242 of the SCK signal 240, for NAP or PDN exit, respectively.

On the next rising edge 244 of the SCK signal 240, a data signal, PDEV signal 280, is sent on the DQx pins. The PDEV signal 280 identifies which among several DRAM devices is being woken up from the NAP/PDN state.

Depending upon the DQ select data bit setting for the DRAM device selected to exit NAP/PDN state, the exit delay time begins at either a first falling edge 246 or a second falling edge 248 of SCK signal 240. At time $t_{NXB}$ or $t_{PXB}$—referring either to NAP exit delay or PDN exit delay—after falling edge 246 or 248, the row-access-control signals 210 and column-access-control signals 220 must enter a quiet state. The quiet cycles 290 on the row-access-control 210 and column-access-control signals 220 must occur exactly $t_{NXB}$ or $t_{PXB}$ after the appropriate falling edge of the SCK signal 240. During the quiet cycle, which lasts at least eight clock cycles of the CTM/CFM signals 270 (at least two clock cycles of the SCK signal 240) no commands may be placed on the row-access-control signal pins 210 or the column-access-control signal pins 220.

Timing a quiet cycle requires complex processing. If commands appear on the row-access-control signals 210 or column-access-control signals 220 during the required quiet time, the memory may be corrupted. Therefore, a worst case scenario must be taken into consideration when designing the memory controller. In the prior art, the memory itself is not aware of the quiet time scheduling and expects a quiet time 290 at an exact time after the $t_{NXB}$ or $t_{PXB}$.

DRAMs are often used in highly pipelined systems. Pipelined systems generally send interrelated and interwoven commands to memory. In order to process a quiet signal 290 at the appropriate time, the commands that would normally be sent during that period must be rescheduled or held for later processing (stalled). All of the commands that are related to the rescheduled commands must be considered. For example, a row-access-control signal 210 may be sent on the row pins. A column-access-control signal 220 must be sent a fixed period after the row signal. This may disrupt pipelining and result in incomplete commands that may result in corrupted data.

One prior art solution is to insert a buffer time prior to the expiration of the NAP/PDN delay. For a time $t_{buff}$ prior to the expiration of the delay $t_{NXB}$ or $t_{PXB}$ no new instructions are sent on the pipeline. The time $t_{buff}$ is set such that, prior to the expiration of the delay $t_{NXB}$ or $t_{PXB}$, all instructions and data that follow the last pipelined instruction can be completed. Thus, for example, $t_{buff}$ is sufficiently long to permit a response for a read query from memory. However, $t_{buff}$ inserts a delay into the pipeline and slows down instruction processing.

In the prior art, the quiet cycle is timed simultaneously on the row-access-control signal 210 and column-access-control signal 220 pins. Because the DRAM may address the row-access-control signal 210 and column-access-control signal 220 pins separately, both must be made inactive separately. This requires additional processing in the memory controller. Additionally, because of the cushioning of related commands around the quiet time 290 a longer delay in the signals being sent to the memory may be introduced.

Therefore, a better method of exiting a memory from a low power state would be advantageous.

SUMMARY OF THE INVENTION

A method and apparatus for exiting a memory from a low power state is disclosed. The method includes initiating an exit from the low power state. The method also includes waiting during an exit delay time period. The method further includes scheduling a quiet time command in an addressing pipeline, where the memory transitions from the low power state to a normal power state in response to a quiet time in response to the quiet time command.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for synchronizing dynamic random access memory exiting from a low power state is described. Certain events or changes in several signals must occur at or near the same time when the memory exits from a low power state. Two of these signal events are a quiet time (a time period with no transitions) on certain address lines and a specific transition in a system clock. Synchronizing an exit quiet time to a system clock allows a reduced latency period, thus improving performance and simplifying the implementation of the memory controller.

Figure 1:
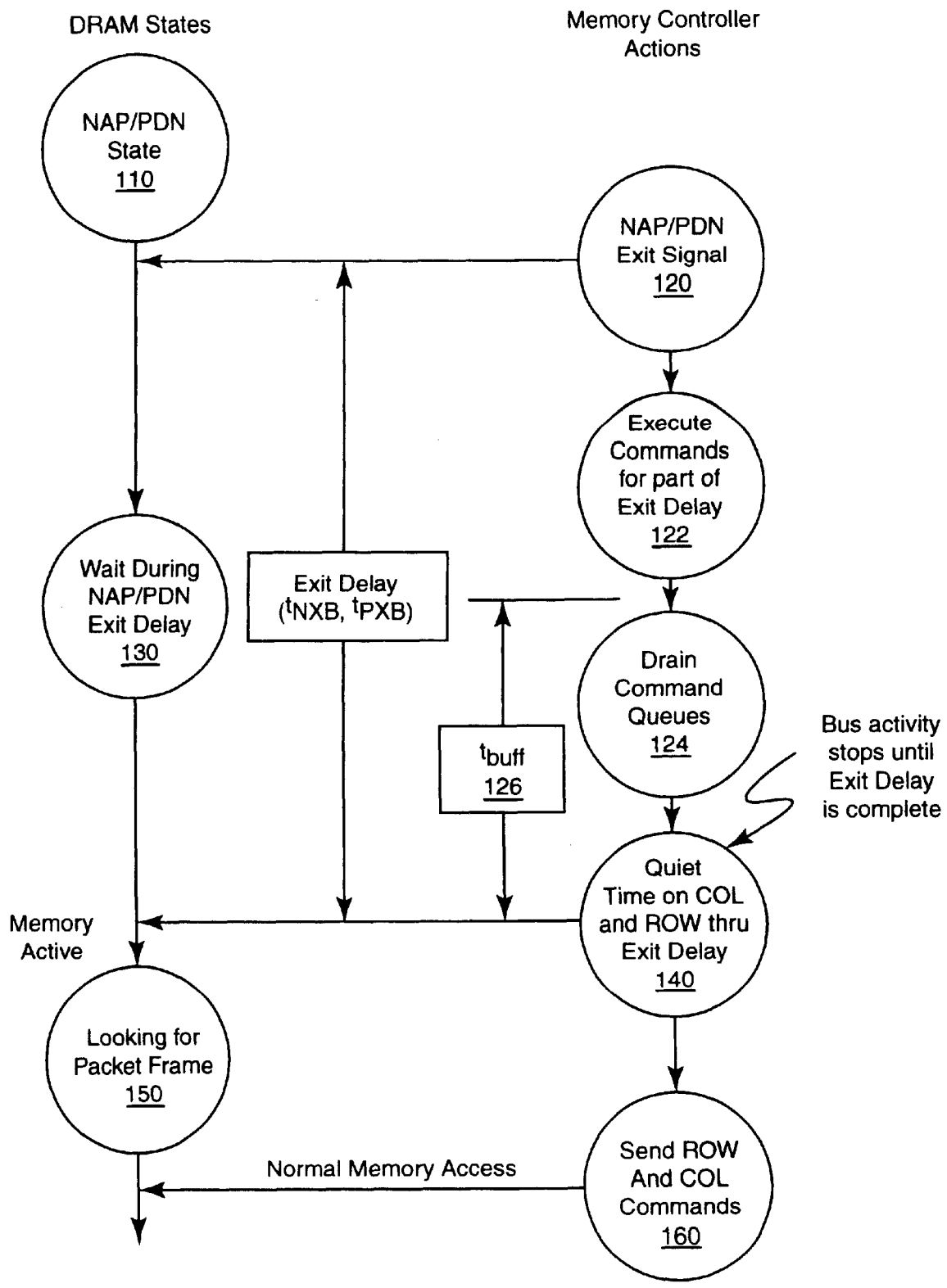
FIG. 1 is a state diagram of a prior art system.
Figure 2:
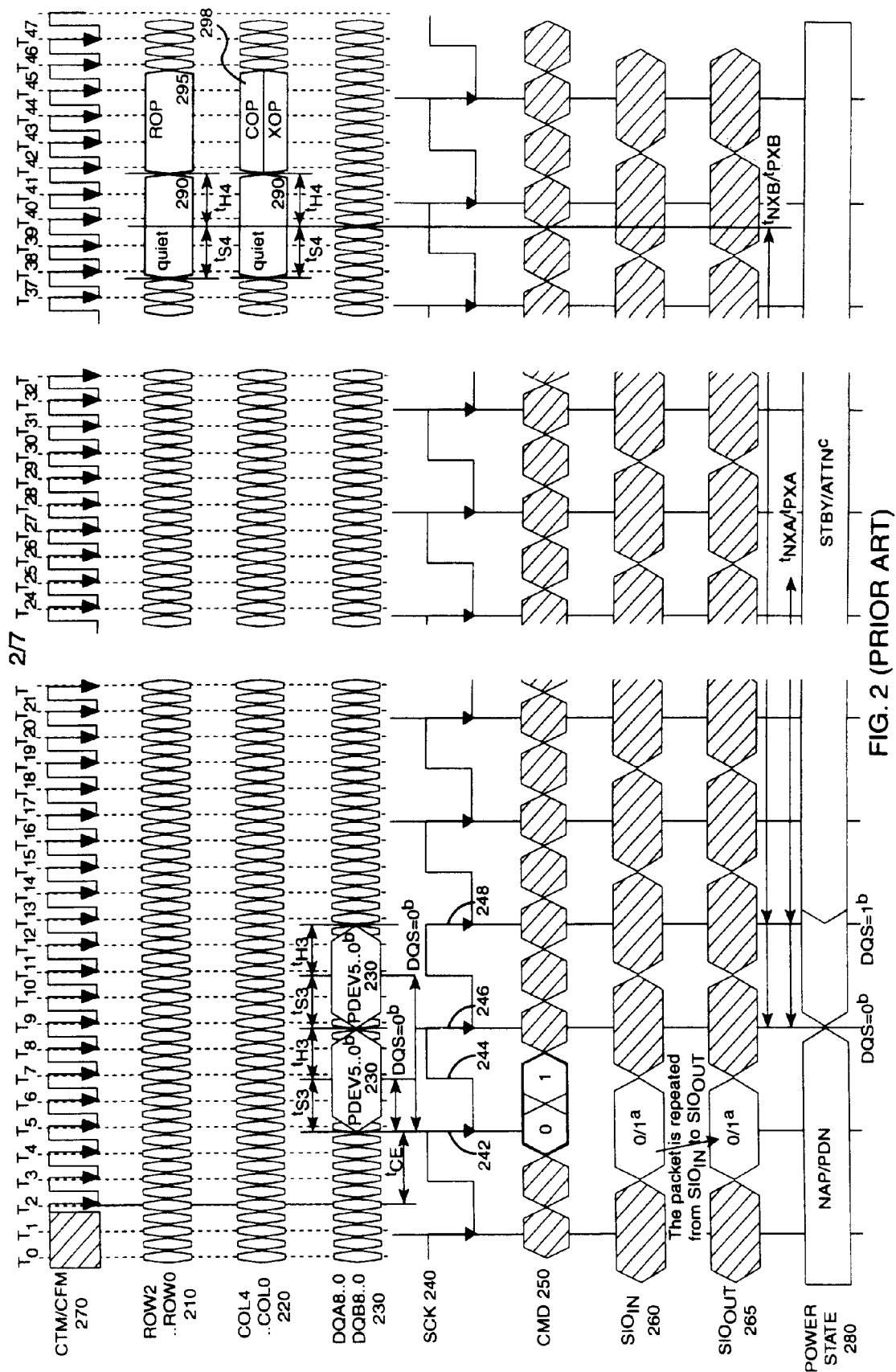
FIG. 2 is a timing waveform diagram of the prior art system of FIG. 1.
Figure 3:
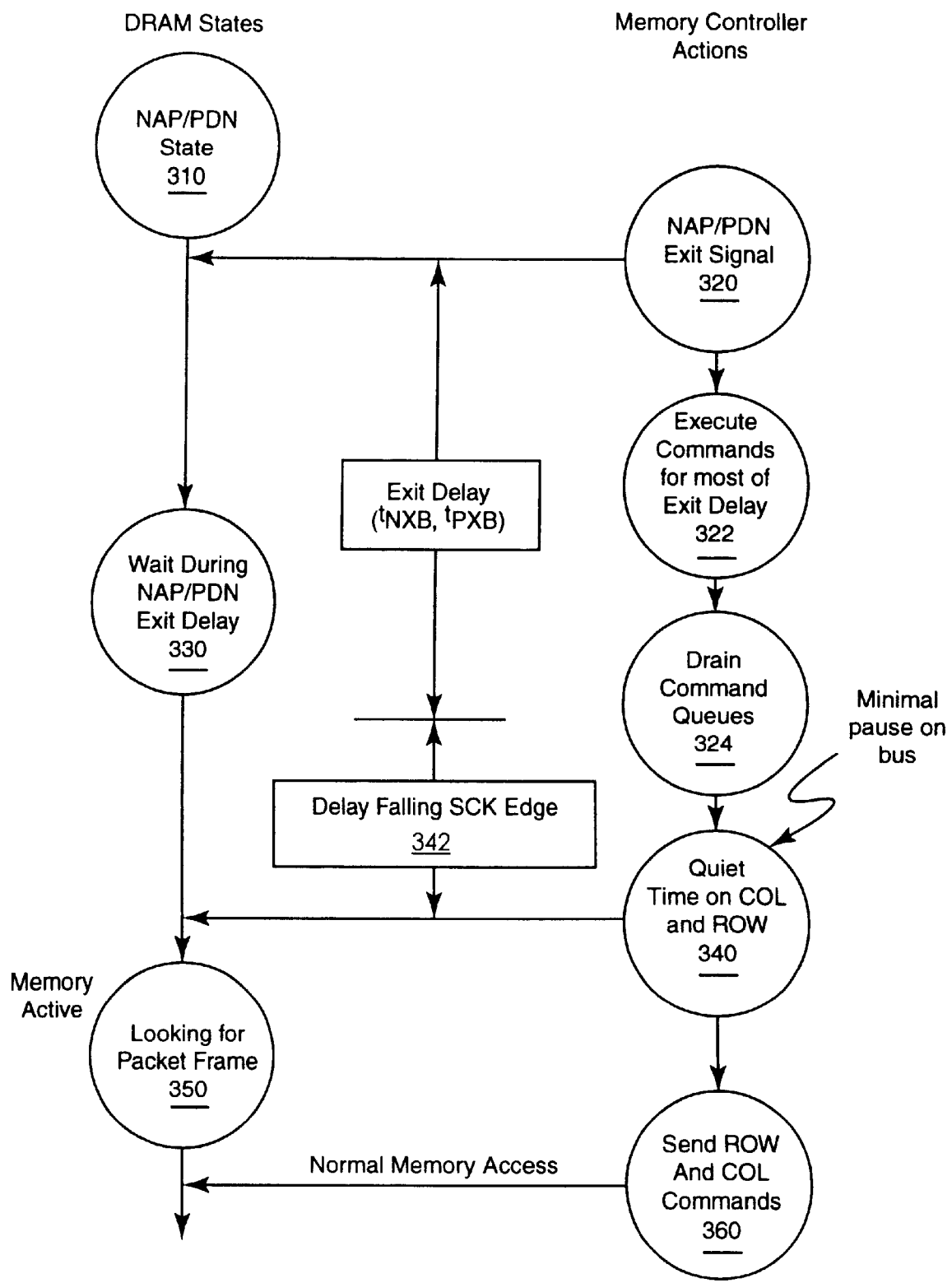
FIG. 3 is one embodiment of a state diagram of a memory system of the present invention.

FIG. 3 illustrates one embodiment of a state diagram of a memory system of the present invention. Initially, the memory is in a NAP/PDN state 310. The NAP/PDN state 310 is a low power state, in which the memory consumes less power than otherwise. The NAP/PDN state 310 is entered in a conventional way. The memory remains in the NAP/PDN state 310 for a period of time. For one embodiment, the memory may remain in the NAP state only for a limited time, while the memory may remain in the PDN state for an extended time. A signal 320 sent by the memory controller to the memory initiates the exit from the NAP/PDN state 310. On receiving the signal, the memory moves from the NAP/PDN state 310 to the wait during NAP/PDN exit delay state 330.

The NAP/PDN exit delay is a period of time used to resynchronize the internal timing circuits and wake up the memory. The length of the NAP/PDN exit delay is determined by the memory type. For one embodiment, for a Direct Rambus Dynamic Random Access Memory (DRDRAM) the period is approximately 100 nano-seconds. Immediately prior to the expiration of this time, the system automatically moves into a send quiet command state 340. The quiet time command is subsequently executed.

In one embodiment, the send quiet command state 340 is a period during which the scheduling circuitry of the memory controller may bypass the normal pipelined memory access commands with a request for a quiet time of the column-access-control (COL) signals and the row-access-control (ROW) signals. (In alternate embodiments, the quiet 10 command may be scheduled in the pipeline without the need of special bypass circuitry.) When the quiet time request has been issued, the system moves into a delay falling edge state 342.

The delay falling edge state 342 is a period during which the memory monitors whether the requested quiet time has been sent over the column-access-control (COL) signals and the row-access-control (ROW) signals. For one embodiment, the quiet time is a series of logic zeroes sent over a number of clock cycles. For another embodiment, the quiet time may be a series of ones, or a certain pattern sent over the COL and ROW signals.

After both the ROW and COL quiet times have occurred, in any order, the system terminates the delay falling edge state 342. When the falling edge of SCK signal occurs, it automatically moves the system into the waiting for packet frame state 350. In this state, the memory is online, and in the same state as prior to entering the low power state. For one embodiment, the memory is either in attention or standby mode in this state.

Figure 4A:
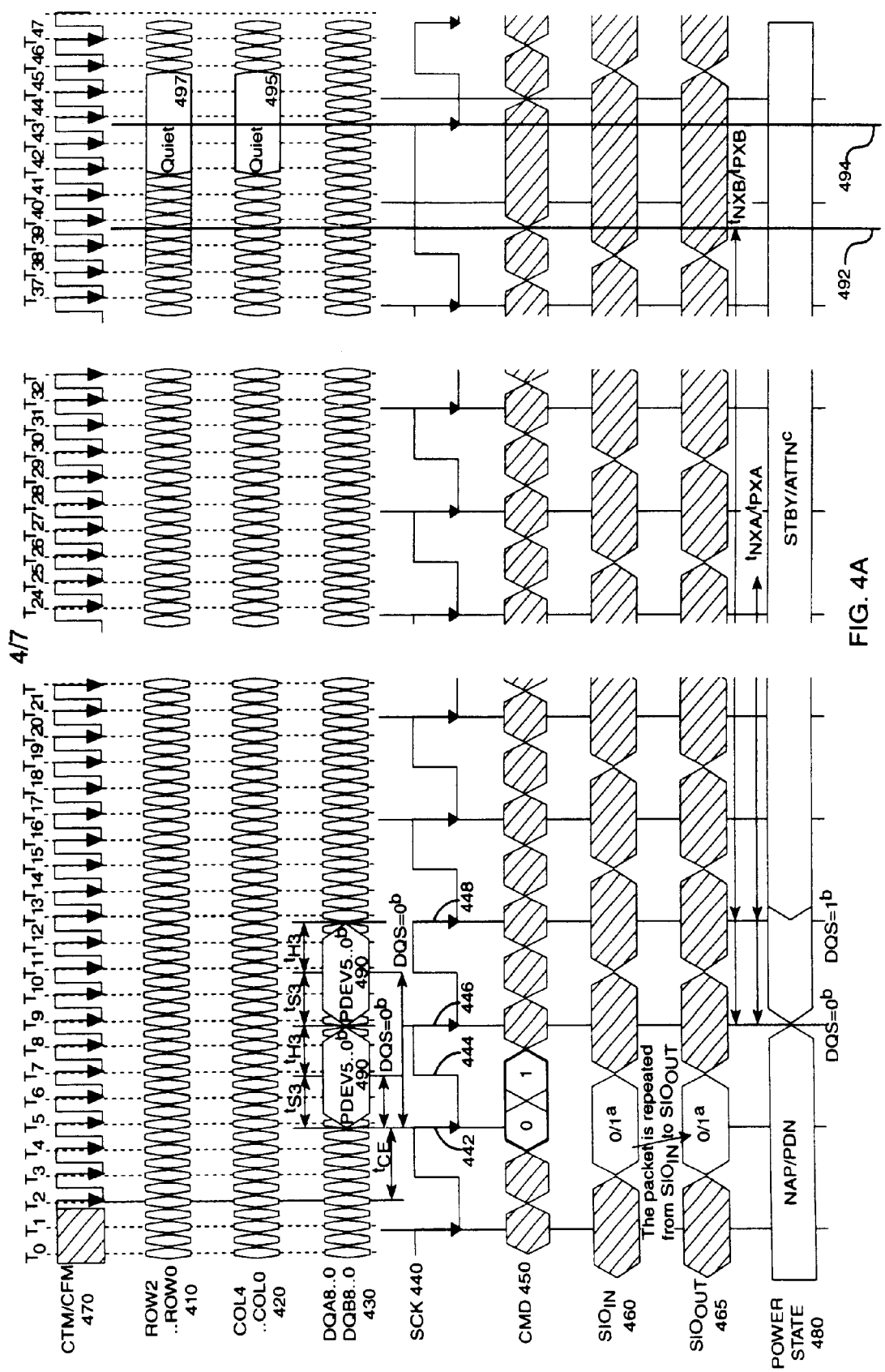
FIG. 4A and FIG. 4B are two embodiments of a timing diagram of the memory system of FIG. 3.
Figure 4B:
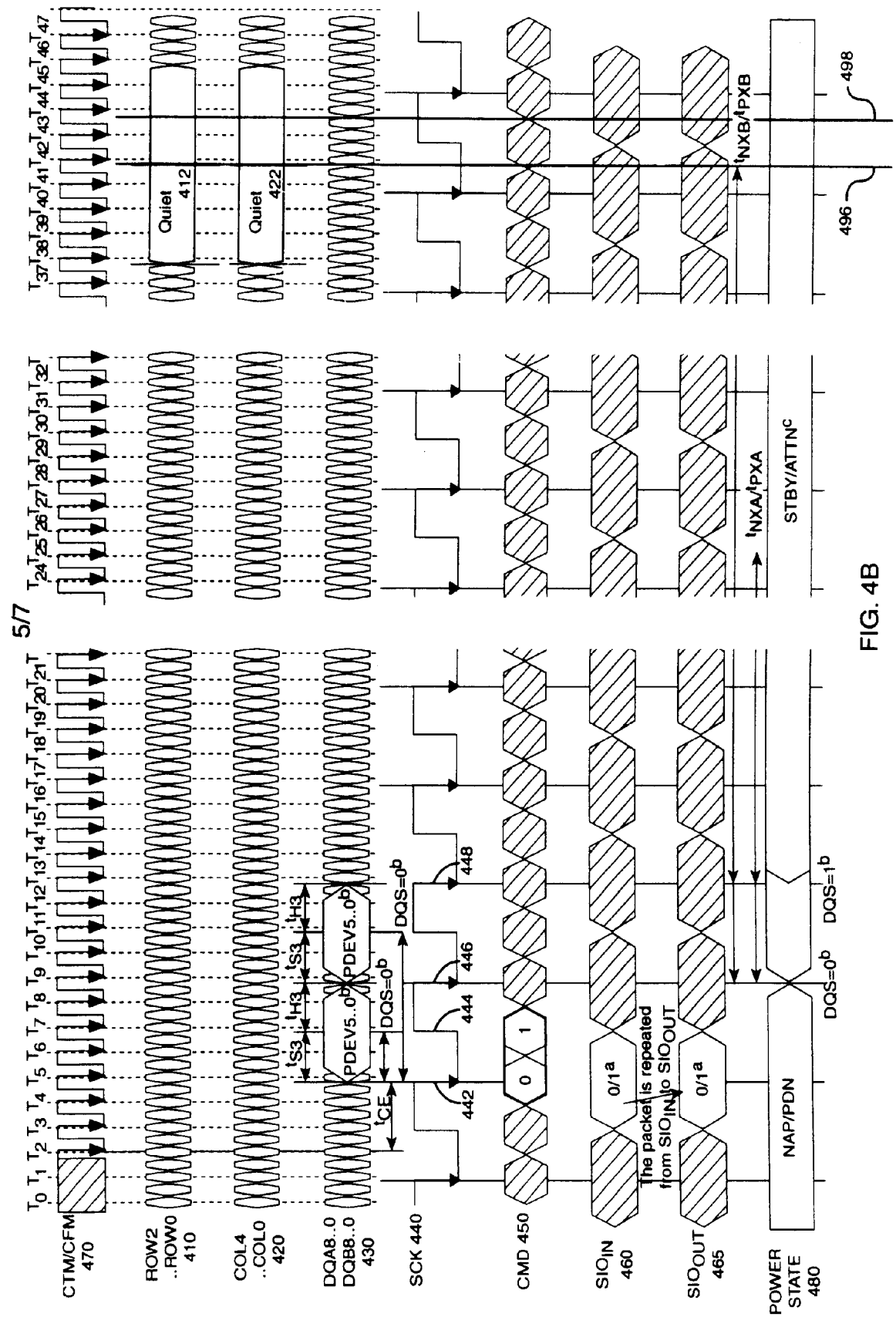

FIG. 4A and FIG. 4B illustrate two timing diagrams of one embodiment of the memory system of the present invention. In order for there to be proper exiting timing from the NAP/PDN state, a quiet time on the row-access-control signals 410 and column-access-control signals 420 must take place at the same time as a particular clock transition on a system clock, clock SCK signal 440. The events described in FIG. 4A and FIG. 4B differ primarily upon whether the quiet time or the clock transition is delayed for the purpose of synchronization. For this reason, the discussion of many of the signals will be common for both FIG. 4A and FIG. 4B.

In FIGS. 4A and 4B, the clock-to-master and clock-from-master (CTM/CFM) signals 470 are used by the memory to time transfer of data from and to the memory controller. For one embodiment, the CTM/CFM signals 470 change state at a rate between 250 and 400 MHz. The clock generating circuit consumes power. Therefore, in one embodiment the system turns off the CTM/CFM signals 470 during PDN state and thus lowers the power consumption of the system. For one embodiment, the internal clock circuits of the memory devices are also turned off to reduce power consumption.

The row-access-control signals 410 and column-access-control signals 420 receive data that identifies the memory location for memory access. Additionally, the row-access-control signals 410 and column-access-control signals 420 are used to indicate that the memory is ready to receive data after a NAP/PDN state by sending a quiet time signal. For one embodiment during the quiet time no logic state transitions occur. For one embodiment, the quiet time lasts at least four clock cycles of the CTM/CFM signal 470.

The DQA and DQB signals 430 are on the data pins that transfer data into and out of the memory location indicated by the row-access-control signals 410 and column-access-control signals 420. A special signal PDEV 490 may be carried on DQA and DQB signals 430. PDEV 490 identifies which among several physical memory devices will exit from the NAP/PDN mode.

The SCK signal 440 is a clock signal. For one embodiment, the SCK signal 440 toggles at one-fourth the frequency of the CTM/CFM signals 490. For one embodiment, the SCK signal 440 changes state at a rate between 62.5 MHz and 100 MHz. The SCK signal 440 is used to clock the exit from NAP/PDN mode. For this reason, the SCK signal 440 may remain active in the NAP/PDN mode. The NAP exit delay $t_{NXB}$ and PDN exit delay $t_{PXB}$ are the time periods after a first falling edge 446 of SCK signal 440 (for NAP exiting) and a second falling edge 448 (for PDN exiting), respectively, which guarantee the proper exiting from the low power states. In one embodiment a fixed number of SCK signal 440 transitions are counted to generate these time periods.

The CMD signal 450 is a command signal used to initialize the exit from the NAP/PDN state. The CMD signal 450 is sampled on both edges of SCK signal 440, the rising edge and the falling edge. To signal the exit from the NAP/PDN state, the CMD signal 450 transitions from a 0 on a first falling clock edge 442 to a 1 on the next rising edge 444 of SCK signal 440. On the first falling edge 442 of the SCK signal 440, the SIOin signal 460 is a 0 to indicate that the exit is from a NAP state, and a 1 to indicate that the exit is from a PDN state.

In PDN state, the CTM/CFM clocks 470 are stopped and must be restarted and stabilized for time $t_{CE}$ before a PDN exit command can be sent. In NAP mode, the CTM/CFM clocks 470 are kept running, and the NAP exit command can be sent whenever needed. In both cases, the dynamic locked loops (DLLs) in the physical memory devices must be restarted in order to resynchronize the internal timing circuits of the memory devices. After the CTM/CFM clocks 470 become stable, a 0 or 1 is sent on the CMD input 450 on the next falling edge 442 of the SCK signal 440, for NAP and PDN exit, respectively.

On the next rising edge 444 of the SCK signal 240, a signal identifying which memory device should exit the NAP/PDN state, PDEV signal 490, is sent on the DQA and DQB signals 430. The memory device(s) indicated by the PDEV signal 490 watch for a quiet time on the row-access-control signal 410 and column-access-control signal 420 occurring after the NAP exit delay $t_{NXB}$ or PDN exit delay $t_{PXB}$ has expired. The quiet times 495, 497 (FIG. 4A) and 412, 422 (FIG. 4B) are scheduled by the memory controller.

Dynamic random access memory (DRAM) is often used in highly pipelined systems. Pipelined systems generally send interrelated and interwoven commands to memory. In order to produce a quiet time, previous implementations of the memory controller would first approximate the amount of time required for a pipelined command to appear on the row-access-command signals 410 and column-access-command signals 420. Using this approximation, the memory controller would then schedule a quiet time to appear at exactly $t_{NXB}$ or $t_{PXB}$ after PDEV signal 490 appears on DQA and DQB signals 430. In order to insure that the quiet time appeared with the proper timing, the scheduled quiet time would need to be buffered, thus making it longer than necessary.

For this reason, one embodiment of the present invention utilizes circuitry that allows the insertion of quiet times 495, 497 (FIG. 4A) or 412, 422 (FIG. 4B) on row-access-control pins and column-access-control pins after the end of $t_{NXB}$ or $t_{PXB}$ without a buffer period. Under the control of the memory controller, the current command in the pipeline for the row-access-control signals 410 and column-access-control signals 420 is permitted to complete. The memory controller then suspends processing of pipeline commands. Quiet times 495, 497 (FIG. 4A) or 412, 422 (FIG. 4B) are sent on row-access-control signals 410 and column-access-control signals 420. Immediately after this quiet times 495, 497 (FIG. 4A) or 412, 422 (FIG. 4B), the processing of pipeline commands resumes.

Two alternate embodiments are discussed. Both require synchronizing the end of $t_{NXB}$ or $t_{PXB}$ with the quiet time. The first embodiment, shown in FIG. 4A, occurs when the end of $t_{NXB}$ or $t_{PXB}$ occurs prior to the quiet times 495, 497. The second embodiment, shown in FIG. 4B, occurs when the quiet times 412, 422 begin prior to the end of $t_{NXB}$ or $t_{PXB}$.

FIG. 4A illustrates the delay of a falling edge of clock SCK signal 440 so that quiet times 495, 497 meet the exit-from-NAP/PDN-state timing requirements of the DRAM. The otherwise free-running clock SCK signal 440 is prevented from performing a downward edge transition subsequent to the expiration of $t_{NXB}$ or $t_{PXB}$, at time 492. This downward edge transition of SCK signal 440 is delayed until quiet times 495, 497 have been sent, at time 494. At time 494, SCK signal 440 makes a delayed downward edge transition. This downward edge transition occurs in the nominal center of quiet times 495, 497, satisfying the exit from NAP/PDN state timing requirements of the DRAM. The delay period is variable, and depends on the timing of the quiet times 495, 497. The quiet times 495, 497 are scheduled to minimize disruption in the pipeline.

Without allowing the delay in the falling edge of SCK signal 440, the memory controller would have a difficult time performing an orderly shutdown of the pipeline for the quiet time before the falling edge of SCK signal 440 occurs. By allowing the delay in the falling edge of SCK signal 440 until time 494, the system timing puts the falling edge of SCK signal 440 at the convenience of the pipeline timing. When the shutdown of the pipeline is delayed, then SCK signal 440 may thus be delayed to compensate.

Because SCK signal 440 provides transmit timing for CMD signal 450, SIOin signal 460, and SIOout signal 465, the delayed downward edge transition of clock SCK signal 440 at time 494 causes a delay in the transmission of CMD signal 450, SIOin signal 460, and SIOout signal 465. This in turn causes a delay in moving the memory to a ready state. However, no buffer time is needed, since the delay in clock SCK signal 440 compensates for the quiet time scheduling issues.

FIG. 4B illustrates an embodiment when the quiet times 412, 422 begins prior to the end of $t_{NXB}$ or $t_{PXB}$. As shown in FIG. 4B, the end of the nominal quiet time of four transitions of CTM/CFM 470 occurs at time 496. But the end of nominal quiet time, time 496, occurs prior to the end of $t_{NXB}$ or $t_{PXB}$, time 498. In this situation, the SCK signal 440 does not delay the downward transition. Instead, the operation of the queue that controls row-access-control signals 410 and column-access-control signals 420 is stalled so that quiet times 412, 422 are extended beyond time 498. Once quiet times 412, 422 extend past the end of $t_{NXB}$ or $t_{PXB}$ at time 498, the stalled condition of the queue is removed to allow subsequent memory accesses.

Figure 5:
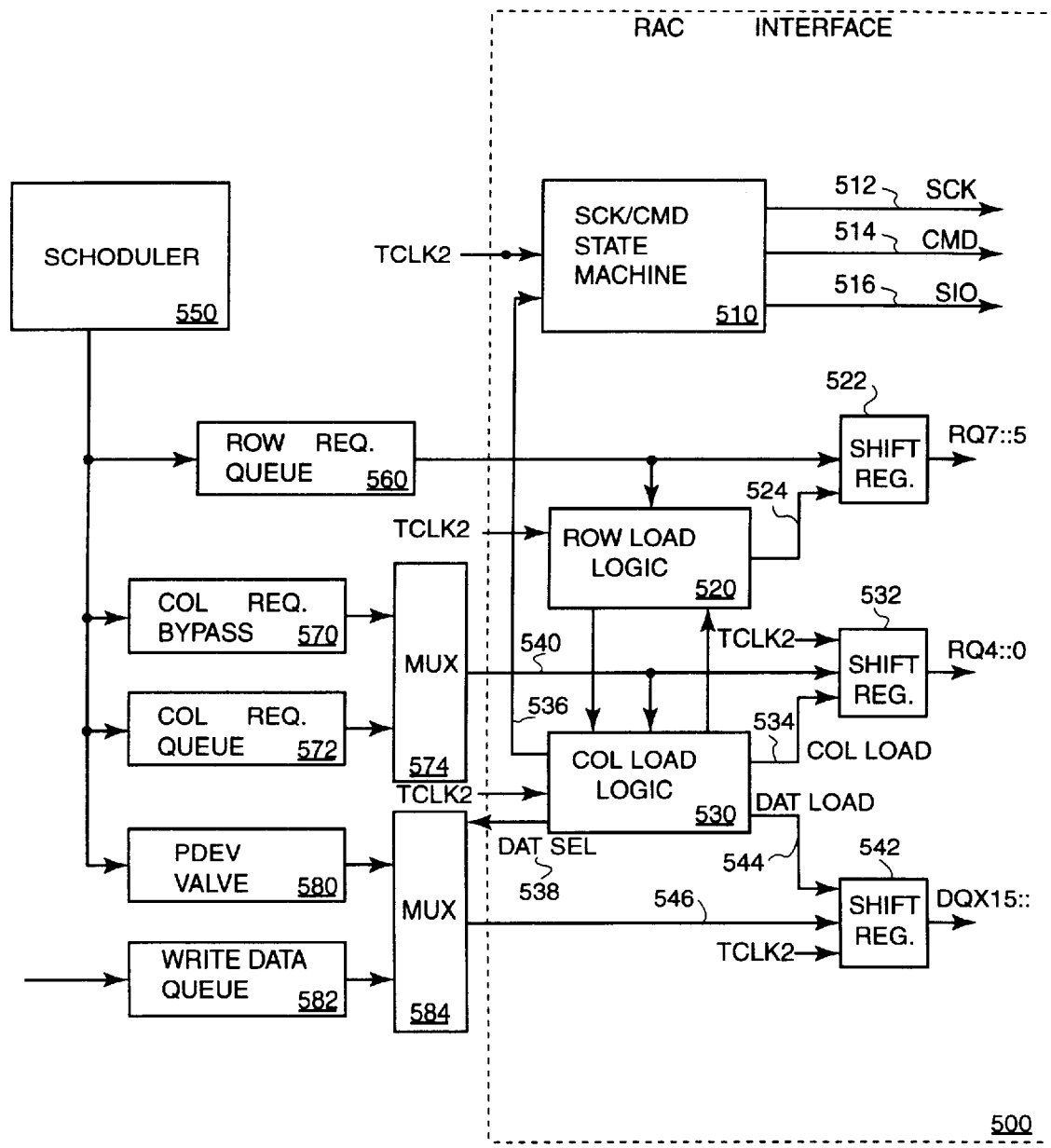
FIG. 5 is a block diagram of one embodiment of a memory controller implementing the timing of FIG. 4.

FIG. 5 is a block diagram of one embodiment of a memory controller implementing the timing of FIG. 4A and FIG. 4B. The memory controller of FIG. 5 includes a DRAM application specific integrated circuit (ASIC) controller (called a RAC) interface 500. The RAC interface 500 includes a SCK/CMD state machine 510 that generates and drives the SCK signal 512, the CMD signal 514, and the SIOout signal 516. In particular, SCK/CMD state machine 510 includes a counter that counts SCK signal 410 transitions and thereby generates the NAP/PDN exit delays $t_{NXB}$ and $t_{PXB}$. In one embodiment, signals generated by SCK/CMD state machine 510 are large-signal, pseudo complementary-metal-oxide-semiconductor (CMOS) logic levels.

The outputs of shift registers 522, 532, and 542 drive the RQ7::5 signals, RQ4::0 signals, and DQx15::0 signals, respectively. The RQ7::5 signals correspond to the row-access-control signals 410 of FIG. 4; the RQ4::0 signals correspond to the column-access-control signals 420 of FIG. 4; and the DQx15::0 signals correspond to the DQA or DQB signals of FIG. 4. For one embodiment, the RQ7::5 signals, the RQ4::0 signals, and the DQx15::0 signals are small-swing signals in Rambus signaling level (RSL) format.

Row load logic 520, column load logic 530, SCK/CMD state machine 510, and shift registers 522, 532, 542 are clocked by a second transmit clock (TCLK2). TCLK2 is derived from CTM/CFM 470 of FIG. 4A and FIG. 4B. In one embodiment, TCLK2 has the same frequency as CTI/CFM 470 but is delayed in phase by 90 degrees.

Scheduler 550 determines the ordering of memory accesses. In one embodiment scheduler 550 may be a design known in the art with the addition of the circuitry to control column request bypass 570 and multiplexor 574. In alternate embodiments scheduler 550 may not need to control a column request bypass 570 and multiplexor 574. In normal operation, scheduler 550 places the row and column address information into a series of queue circuits, including the row request queue 562 and column request queue 572, respectively. These queue circuits form an address pipeline. The data in the row request queue 562 and column request queue 572 is later advanced into shift registers 522, 532, respectively, by the row load signal 524 and column load signal 534, respectively.

In a similar fashion, data for a memory write operation is placed into a write data queue 582. The data in write data queue 582 is later advanced into shift register 542 by data load signal 544.

As previously noted, a quiet time on RQ7::5 and RQ4::0, subsequent to the time periods $t_{NXB}$ or $t_{PXB}$ of FIG. 4, is required by the memory during the memory's exit from the NAP/PDN state. Scheduler 550 determines timing in the memory controller, and therefore knows when the time periods $t_{NXB}$ or $t_{PXB}$ should end. In order to minimize the disruption of the memory access pipeline, in one embodiment scheduler 550 may suspend normal pipelined operations near the end of time periods $t_{NXB}$ or $t_{PXB}$. In this one embodiment, in order to suspend normal pipelined operations and place a quiet time on RQ7::5 and RQ4::0, scheduler 550 routes the quiet time command through the column request bypass 570 circuit and places the identity of the physical device which will exit the NAP/PDN state into the PDEV value 580 register. In this manner the required quiet time may arrive essentially immediately subsequent to the end of time periods $t_{NXB}$ or $t_{PXB}$ In alternate embodiments, scheduler 550, knowing the timing of the commands, may schedule the quiet time command in the regular schedule of commands in the ROW request queue 562 and COL request queue 572.

In response to the quiet time command's arrival in column request bypass 570, column load logic 530 switches multiplexers 574, 584 to select the contents of column request bypass 570 and PDEV value 580. Column load logic 530 issues the data select 538 signal to operate multiplexers 574, 584. The column load logic 530 additionally informs SCK/CMD state machine 510 via signal line 536 of the presence or absence of the quiet times 495, 497. This allows SCK/CMD state machine 510 to suspend the following downward edge transition on SCK signal 512 if required.

Consider the first situation discussed above in conjunction with FIG. 4A. This situation occurs when the end of $t_{NXB}$ or $t_{PXB}$ takes place prior to the quiet times 495, 497. Recall that the NAP/PDN exit delays $t_{NXB}$ and $t_{PXB}$ are generated within SCK/CMD state machine 510. Therefore SCK/CMD state machine 510 knows when the NAP/PDN exit delays $t_{NXB}$ and $t_{PXB}$ have ended. If the quiet times 495, 497 are not present when the NAP/PDN exit delays $t_{NXB}$ and $t_{PXB}$ have ended, SCK/CMD state machine 510 for one embodiment delays the downward edge transition of SCK signal 512 until such time as quiet times 495, 497 are present. At this time, column load logic 530 changes the data select 538 signal to allow the pipelined operations stored in column request queue 572 and write data queue 582 to pass through multiplexers 572, 582, respectively, and from there into the shift registers 532, 542. Column load logic 530 also changes the signal on signal line 536 to the SCK/CMD state machine 510. From this point on, the memory is awake, and the pipelined operations continue normally.

Consider alternatively a second embodiment discussed above in conjunction with FIG. 4B. This second situation occurs when the quiet times 412, 422 begin prior to the end of $t_{NXB}$ or $t_{PXB}$. In this case, row load logic 520 and column load logic 530 stall the pipelined operations and thereby extend quiet times 412, 422. Quiet times 412, 422 may then extend past the end of $t_{NXB}$ or $t_{PXB}$, as shown in FIG. 4B. Row load logic 520 and column load logic 530 may stall the pipelined operations of row request queue 562 and column request queue 572 by delaying the assertion of row load signal 524 and column load signal 534, respectively. Once the end of $t_{NXB}$ or $t_{PXB}$ occurs, row load logic 520 and column load logic 530 may then remove the stalled condition of the pipelined operations by asserting row load signal 524 and column load signal 534.

Figure 6:
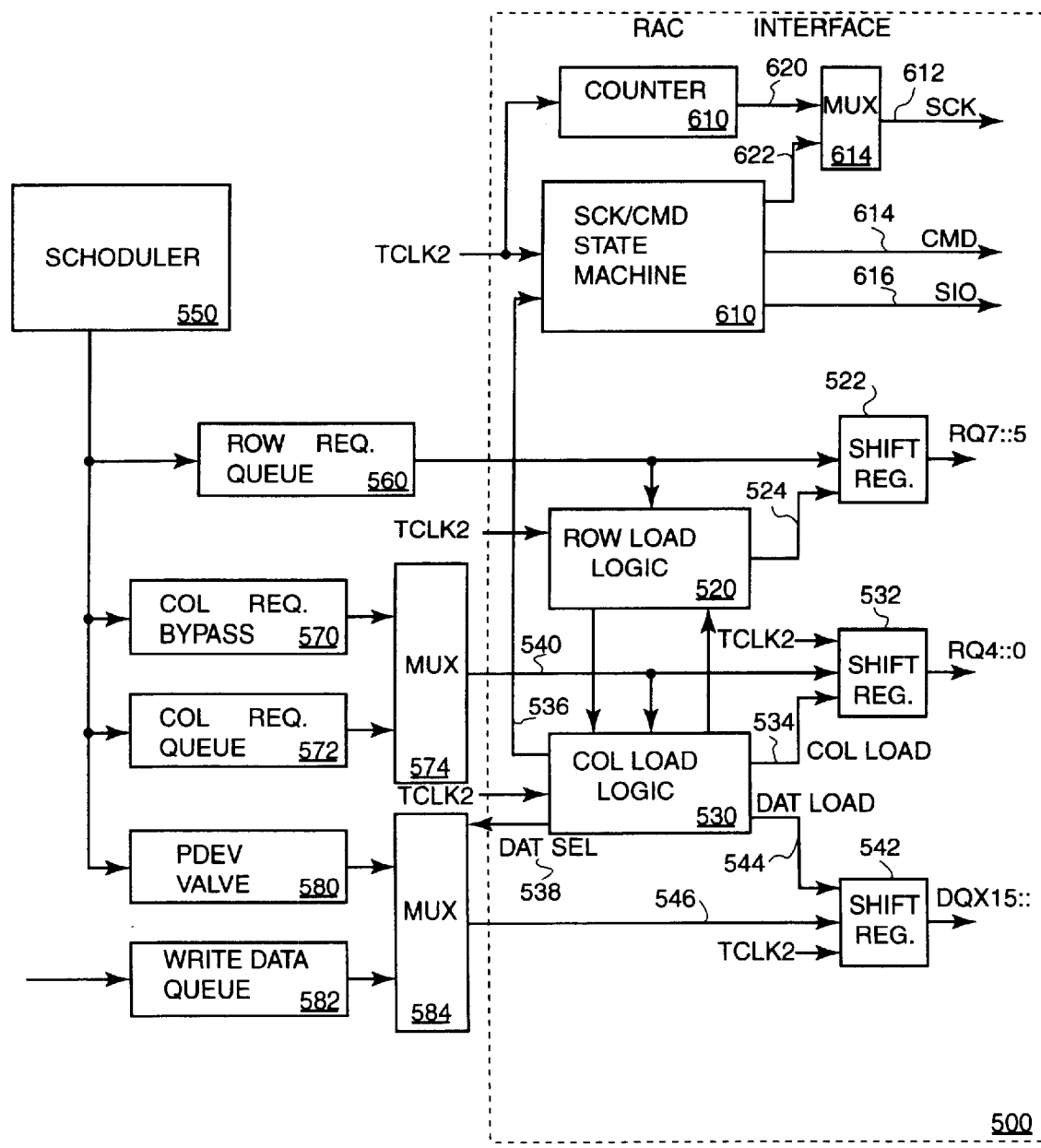
FIG. 6 is a block diagram of an alternate embodiment of memory controller of the present invention.

FIG. 6 is a block diagram of an alternate embodiment of a memory controller of the present invention. In the FIG. 5 embodiment, the original phase relationship of SCK signal 512 with respect to other circuitry in the memory system may be lost when the falling edge of SCK signal 512 is delayed during an exit from a NAP/PDN state. In certain circumstances it may be beneficial to maintain the phase relationship of SCK signal 512 with other elements of the memory circuit.

Therefore, in the FIG. 6 embodiment, the primary source of SCK signal 512 is a free-running divide-by-four counter 610. Counter 610 supplies a free-running clock signal on signal line 620, derived from TCLK2, for use as SCK signal 612. This free-running clock signal on signal line 620 passes through a synchronous multiplexor 614 before emerging as SCK signal 612. In one embodiment, TCLK2 is a buffered version of the clock-to-master CTM signal 470.

In the FIG. 6 embodiment, as in the FIG. 5 embodiment, the SCK/CMD state machine 610 determines the necessity of a delayed falling edge of SCK signal 612 according to the timing requirements discussed above. To summarize these timing requirements, the otherwise free-running clock signal SCK signal 440 is prevented from performing a downward edge transition subsequent to the expiration of $t_{NXB}$ or $t_{PXB}$, at time 492, until quiet times 495, 497 appear on the row-access-control signal pins and column-access-control signal pins.

When SCK/CMD state machine 610 determines the need for a delayed falling edge of SCK signal 612, it sends a suspend signal on signal line 622 to synchronous multiplexor 614. The suspend signal on signal line 622 suspends subsequent falling edge transitions of free-running clock signal on signal line 620 from emerging at SCK signal 612.

For one embodiment, if SCK signal 612 was at a high logic state when the suspend signal arrived at synchronous multiplexor 614, then the SCK signal 612 is kept at a high logic state during the period of the suspend signal. Conversely, if SCK signal 612 was at a low logic state when the suspend signal arrived at synchronous multiplexor 614, then SCK signal 612 is permitted to transition to and then remain at the high logic state. In either case, for one embodiment SCK signal 612 enters a suspend period at the high logic state.

SCK/CMD state machine 610 determines that quiet times 495 has appeared on row-access-control signals 410 and column-access-control signals 420, based upon clock delay enable signal 536 of column load logic 530. When this occurs, a falling edge transition is permitted, and the suspend signal on signal line 622 is withdrawn. Once the suspend signal on signal line 622 is withdrawn, synchronous multiplexor 614 allows the next falling edge transition of free-running clock signal on signal line 620 to emerge on SCK signal 612. This next falling edge transition occurs at a normal transition time of the free-running clock, which therefore resynchronizes the overall system with respect to SCK signal 612.

In the foregoing specification, the invention has been described with reference to specific exemplary embodiments thereof. It will, however, be evident that various modifications and changes may be made thereto without departing from the broader spirit and scope of the invention as set forth in the appended claims. The modifications and changes may be made for example to the method used to drive the SCK transitions or to the method of delivering the quiet time across the interfaces shown. The specification and drawings are, accordingly, to be regarded in an illustrative rather than a restrictive sense.

What is claimed is:

1. A method comprising:
   initiating an exit from a low power state;
   waiting during an exit delay time period;
   scheduling a quiet time command in an addressing pipeline, where a memory transitions from the low power state to a normal power state in response to a quiet time in response to the quiet time command; and
   delaying a clock signal to ensure proper exiting timing.

2. The method of claim 1, wherein said delaying a clock signal includes delaying said clock signal until a quiet time follows the quiet time command.

3. The method of claim 2, wherein delaying the clock signal includes delaying a clock edge of the clock signal.

4. The method of claim 3, wherein delaying the clock signal utilizes a state machine.

5. The method of claim 2, wherein delaying the clock signal includes delaying a clock edge of the clock signal and resynchronizing the clock signal with a free running clock.

6. The method of claim 5, wherein resynchronizing the clock signal utilizes a counter and a synchronous multiplexor.

7. The method of claim 2, wherein said scheduling includes bypassing said addressing pipeline.

8. A method comprising:
   issuing a quiet time command;
   waiting during an exit delay time period; and
   synchronizing a clock signal to a quiet time occurring subsequent to the quiet time command.

9. The method of claim 8 wherein said step of synchronizing includes delaying a clock signal transition of said clock signal until the occurrence of said quiet time.

10. The method of claim 9 wherein said step of delaying said clock signal transition occurs subsequent to the exit delay time period.

11. The method of claim 9 wherein said step of delaying said clock signal transition includes monitoring access-control signals for the presence of said quiet time.

12. The method of claim 8 wherein said step of synchronizing includes extending said quiet time until a clock signal transition of said clock signal occurs.

13. The method of claim 12 wherein said step of extending said quiet time includes stalling a pipeline queue.

14. The method of claim 13 wherein said step of stalling a pipeline queue includes delaying a load signal.

15. An apparatus comprising:
    means for initiating an exit from a low power state;
    means for waiting during a exit delay time period;
    means for scheduling a quiet time command in an addressing pipeline, where a memory transitions from the low power state to a normal power state in response to a quiet time in response to the quiet time command; and
    means for delaying a clock signal to ensure proper exiting timing.

16. A circuit comprising:
    a scheduler configured to control a command pipeline and initiate an exit from a low power state;
    the scheduler further configured to control an exit delay time period;
    a queue circuit coupled to the scheduler configured to insert a quiet time command into an address pipeline, where a memory transitions from the low power state to a normal power state in response to a quiet time in response to the quiet time command; and
    a circuit element configured to delay a first clock signal to ensure proper exiting timing.

17. The circuit of claim 16, wherein said circuit element includes a clock circuit coupled to the queue circuit configured to delay said first clock signal.

18. The circuit of claim 17, wherein the clock circuit delays the first clock signal until a quiet time follows the quiet me command.

19. The circuit of claim 18, wherein the clock circuit delays a clock edge of the first clock signal and then initiates a free running clock signal.

20. The circuit of claim 18, wherein the clock circuit delays a clock edge of the first clock signal and then resynchronizes the first clock signal with a free running clock signal.

21. The circuit of claim 20, wherein the clock circuit includes a free running counter configured to generate the free running clock signal.

22. The circuit of claim 21, wherein the free running counter is coupled to a synchronous multiplexor.

23. The circuit of claim 16, further comprising a bypass circuit coupled to the queue circuit configured to interrupt the address pipeline.

24. The circuit of claim 23, wherein the bypass circuit and the queue circuit are both coupled to a multiplexor.

25. The circuit of claim 24, wherein the multiplexor transmits a plurality of access control signals to the memory.

* * * * *